United States Patent [19]

Ariizumi et al.

[11] Patent Number: 4,578,694

[45] Date of Patent: Mar. 25, 1986

[54] INVERTER CIRCUIT PROVIDED WITH GATE PROTECTION

[75] Inventors: Shoji Ariizumi; Makoto Segawa, both of Tokyo, Japan

[73] Assignee: Tokyo Shibaura Denki Kabushiki Kaisha, Kawasaki, Japan

[21] Appl. No.: 429,183

[22] Filed: Sep. 30, 1982

[30] Foreign Application Priority Data

Oct. 20, 1981 [JP] Japan .............................. 56-167556

[51] Int. Cl.$^4$ ................... H01L 27/04; H01L 29/78; H03K 17/08; H03K 17/687
[52] U.S. Cl. .................. 357/41; 357/23.13; 357/23.12; 307/450; 361/91
[58] Field of Search ............ 357/236 P, 230, 41, 357/23.12, 23.13; 307/448, 450, 468, 542; 361/91, 58

[56] References Cited

U.S. PATENT DOCUMENTS

| | | | |
|---|---|---|---|
| 3,969,744 | 7/1976 | Nicholas | 357/23 D |
| 4,069,430 | 1/1978 | Masuda | 307/450 |
| 4,239,980 | 12/1980 | Takanashi | 307/450 |
| 4,385,337 | 5/1983 | Asano et al. | 357/236 GP |

FOREIGN PATENT DOCUMENTS

| | | | |
|---|---|---|---|
| 2738185 | 3/1979 | Fed. Rep. of Germany | 357/23 D |
| 52-2266 | 1/1977 | Japan | 307/450 |
| 52-67548 | 6/1977 | Japan | 307/450 |
| 56-81965 | 7/1981 | Japan | 357/23 GP |

*Primary Examiner*—William D. Larkins
*Assistant Examiner*—Mark Prenty
*Attorney, Agent, or Firm*—Oblon, Fisher, Spivak, McClelland & Maier

[57] ABSTRACT

An integrated circuit serving as an E/D type inverter circuit and provided with a gate-protection circuit. The inverter circuit is constructed of an E type MOSFET having a gate coupled to an input signal and a D type MOSFET which operates as load, and the gate-protective circuit is constructed by a MOSFET which is connected between a power supply and the D type MOSFET and whose gate is connected to the power supply. The gate of the D type MOSFET is protected by the gate-protection circuit even if noise exists on the power supply line.

2 Claims, 4 Drawing Figures

INVERTER CIRCUIT PROVIDED WITH GATE PROTECTION

BACKGROUND OF THE INVENTION

1. Field of the Invention

This invention relates to an integrated circuit including an inverter circuit constructed by an enhancement type (E type) MOSFET and a depletion type (D type) MOSFET, and a gate-protection circuit.

2. Description of the Prior Art

An inverter circuit used in a prior art integrated circuit device is shown in FIGS. 1 and 2. As shown in FIG. 1, D type MOSFET (1) and E type MOSFET (2) are connected in series between power supply Vcc, for example 5V, and reference potential Vss, for example ground potential. The gate electrode of MOSFET (1) is connected to a connecting point of MOSFET (1) and MOSFET (2). An input signal Vin is coupled to the gate electrode of MOSFET (2), and an output signal Vout is derived from the connecting point of MOSFET (1) and MOSFET (2). MOSFET (1) operates as a load and MOSFET (2) operates as a driver. A sectional view of the inverter circuit in FIG. 1 is shown in FIG. 2. N+ diffusion regions (3), (4) and (5) are formed in P type semiconductor substrate (6). E type MOSFET (2) is constructed from N+ source region (3), N+ drain region (4) and gate electrode (7) formed on gate insulation layer (8), and D type MOSFET (1) is constructed from N+ source region (4), N+ drain region (5) and gate electrode (9) formed on gate insulation layer (10). Arsenic ion is implanted in the channel region between the N+ source and drain regions (4) and (5), and the gate electrode (9) is connected to the N+ source region (4). This inverter circuit is a ratio circuit in which logic levels of "1" and "0" are distinguished from each other by establishing appropriately the ratio $$\alpha = \beta d/\beta l \qquad (1)$$

of the geometrical sizes of driver MOSFET (2) and load MOSFET (1). In formula (1), $\beta d$ is the ratio [W/L] of channel width W and channel length L of the driver MOSFET (2), and $\beta l$ is the ratio of these parameters of the load MOSFET (1).

Generally the value of the ratio $\alpha$ is established at three to five. This value is appropriate for an inverter circuit which operates as part of a circuit constructed of MOSFETs or whose signal level fully swings from Vss to Vcc, but is not preferable where the circuit is used as an input stage. It is desirable that the value of the ratio $\alpha$ is established at ten to twenty for use as an input stage, for the following reason. Input signals inverters internal to the usual integrated circuit are low level of about 0 V or high level of about 5 V, Vcc, but input signals to the input stage of the integrated circuit usually have TTL (transistor-transistor-logic) levels and are low level at about 0 to 0.8 V and high level at about 2.0 V. Generally, the drain current $I_D$ of a MOSFET is defined by the following formula:

$$I_D \propto (V_{GS} - V_{th}) \cdot gm \qquad (2)$$

where,
$V_{GS}$: gate-source voltage
$V_{th}$: threshold voltage
$V_D$: source-drain voltage
gm: mutual conductance In formula (2), $V_{th}$ and gm are determined by the shape of the MOSFET, gm is in proportion to W/L of the MOSFET, and $V_{th}$ is about $-0.6$ V in the usual E type MOSFET. $V_{GS}$ is the voltage between the gate electrode and Vss, and corresponds to the input signal Vin. From formula (2), when $V_{GS}$ is increased from about 2 V to about 5 V, gm will have to be decreased with the same rate in order to derive the same current, too. So, the ratio $\alpha$ is three to five when input signal is Vss to 5 V, as with the usual circuit, but must be ten to twenty when the input signal is Vss to 2 V as the circuit of an input stage whose input signal has TTL levels.

But, the circuit of the input stage is not always used with TTL level input signals, and can be used with input signal levels of about Vss and Vcc in several life tests and some uses. In this case, an input signal of Vcc is provided to the gate of driver MOSFET (2), and the output level of the inverter circuit becomes about the Vss level. Excessive drain current flows in the load MOSFET (1) because gm ($\propto$ W/L) of the MOSFET (2) is greater than that of the MOSFET (1) and Vcc is provided between the gate and drain of the load MOSFET, (1). In the event of severe use like this, the gate of the MOSFET (1) may be destroyed by noise on the Vcc terminal which occasionally includes high voltage spikes or surge voltages. This has caused destruction of integrated circuit devices and reduces reliability.

SUMMARY OF THE INVENTION

It is accordingly an object of this invention to provide a novel integrated circuit including an inverter circuit with high reliability.

Another object of this invention is to provide an integrated circuit having a circuit which protects the gate of a load MOSFET in an inverter circuit of an input stage.

Another object of this invention is to provide an integrated circuit with high immunity to destruction by power supply noise.

These and other objects are achieved according to the invention by providing an integrated circuit including a first MOSFET having a gate coupled to an input signal, a second MOSFET having a gate and a source connected to a drain of the first MOSFET, and a third MOSFET having a gate and a drain connected directly to a power supply and a source connected to a drain of the second MOSFET, wherein an output signal corresponding to the input signal is derived from the drain of the first MOSFET.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
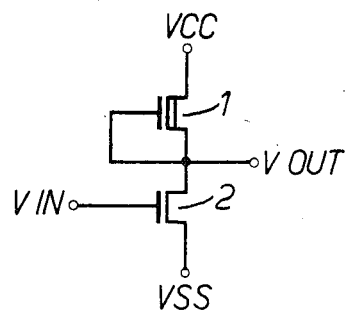
FIG. 1 is a circuit diagram of a conventional inverter circuit.
Figure 2:
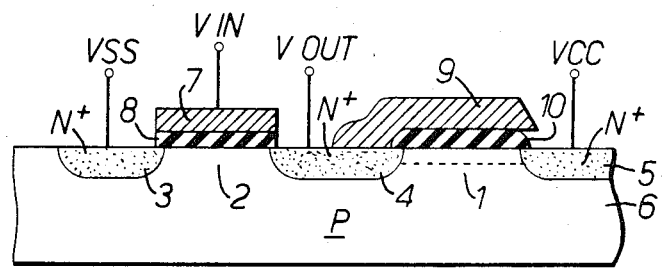
FIG. 2 is a cross-sectional view of a conventional inverter circuit device.
Figure 3:
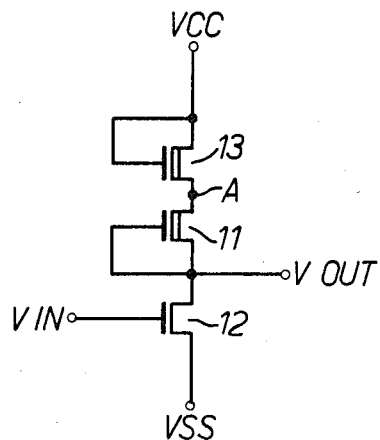
FIG. 3 is a circuit diagram of an inverter circuit according to the invention.
Figure 4:
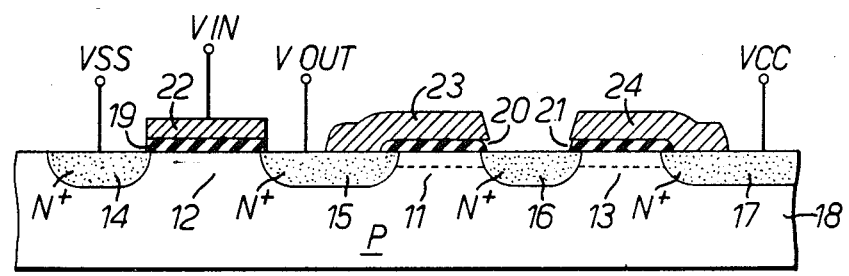
FIG. 4 is a cross-sectional view of an inverter circuit device as shown in FIG. 3.

Referring now to the drawings, wherein like reference numerals designate identical or corresponding parts throughout the several views, and more particularly to FIGS. 3 and 4 thereof, one embodiment of the integrated circuit device of this invention is illustrated. As shown in FIG. 3, the inverter circuit is constructed by connection of D type N-channel MOSFET (11) and E type N-channel MOSFET (12) in series. Input signal Vin is coupled to a gate of MOSFET (12), and output signal Vout is derived from the connecting point of D type MOSFET (11) and E type MOSFET (12). The source of MOSFET (12) is connected to a standard potential Vss, for example ground potential, and the gate of MOSFET (11) is connected to its own source and the drain of MOSFET (12). The drain of MOSFET (11) is connected to the source of D type N-channel MOSFET (13) which operates as a gate-protection circuit of MOSFET (11). The gate of MOSFET (13) is directly connected to its own drain and the power supply Vcc, for example 5 V. The ratio $\alpha$ of MOSFET (11) and MOSFET (12) is established at about ten to twenty, and this value is appropriate in the case that the circuit is used as an input stage with a TTL level input signal Vin as explained above. When the input signal is more than 2 V, MOSFET (12) becomes fully conductive because the ratio $\alpha$ is established at about ten to twenty, and the output signal Vout becomes the Vss level.

Nextly, when the input signal Vin is at a Vss ground level, MOSFET (12) is at a Vcc level because the gate of MOSFET (13) is connected to Vcc and MOSFET (13) is a D type MOSFET. Moreover, even if the input signal Vin was 0.8 V, the output signal Vout must be at the Vcc level. But MOSFET (12) does become a little conductive because the input signal (0.8 V) is higher than the threshold voltage Vth (=0.6 V) of MOSFET (12), and a leakage current flows from the Vcc terminal to the Vss terminal. As the output voltage Vout is determined by the following equation in this state, it is preferable that the value $R_{13}$ of a resistive element of MOSFET (13) be small in order to derive Vout close to Vcc $$Vout = \frac{R_{12}}{R_{12} + R_{11} + R_{13}} \ Vcc \quad (3)$$

wherein $R_{11}$, $R_{12}$ and $R_{13}$ designate values of a resistive elements of MOSFETs (11), (12) and (13), respectively. But it is not preferable for the reason explained hereinafter that the value of $R_{13}$ be too low.

Nextly, the gate-protection function of MOSFET (13) is explained. The drain current of MOSFET (11) is established the same as that of the prior circuit. In this circuit even if a high noise signal is provided to the Vcc terminal, the gate of MOSFET (13) is not destroyed because the gate and drain of MOSFET (13) are connected to each other and the voltage between them is constant. The voltage of the connection point A becomes an intermediate voltage between Vss and Vcc because MOSFETs (11) and (13) act as a voltage divider circuit. So, the gate-drain voltage of MOSFET (11) is lower than Vcc and this circuit has high margin to noise on Vcc. Moreover, the noise voltage of the connection point A is decreased because of the resistive element of MOSFET (13). Generally, a resistor functions to decrease a surge voltage. So, the potential of the connection point A does not become as high as the noise voltage, and the gate-drain voltage of MOSFET (11) is not changed so much, either. As a result, the gate of MOSFET (11) is protected by MOSFET (13). Then, it is preferable to provide a large value of the resistive element of MOSFET (13) in order to decrease the noise voltage, but the value of $R_{13}$ should not be too high because the output Vout does not become Vcc fully when the input voltage Vin is about 0.8 V. The value of $R_{13}$ must be established at the best value considering both these points.

FIG. 4 shows the physical structure of the circuit in FIG. 3. N+ regions (14), (15), (16) and (17) are formed on a P type semiconductive substrate (18). N+ regions (14), (15), (16) and (17) are respectively the source region of MOSFET (12), the drain region of MOSFET (12) and the source region of MOSFET (11), the source region of MOSFET (13) and the drain region of MOSFET (11), and the drain region of MOSFET (13). Gate insulation layers (19), (20) and (21) and gate electrodes (22), (23) and (24) are respectively formed on channel regions of MOSFETs (12), (11) and (13). The gate electrodes (23) and (24) of MOSFETs (11) and (13) are respectively connected to the N+ region (15) and (17). Arsenic ion is implanted in the channel regions of MOSFET (11) and (13) in order to change the threshold voltage in the negative direction and changes MOSFETs (11) and (13) to D type MOSFETs. MOSFET (13) will be formed by the same process as MOSFET (11) in this embodiment.

Though a D type MOSFET is used as the gate-protection circuit in this embodiment, an intrinsic type MOSFET whose threshold voltage is about 0 V can be used instead. Further, an E type MOSFET may be also used instead, but the output level will be decreased as much by the threshold voltage of this MOSFET. The integrated circuit of this invention need not only be constructed of N-channel MOSFETs but also can be constructed of P-channel MOSFETs.

As explained above, the gate of load MOSFET is protected even if noise having high spikes or surge voltage is generated on the power supply terminal. The integrated circuit of this invention has high reliability and can be constructed simply.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An integrated circuit comprising:
   a first enhancement type MOSFET having a gate coupled to an input signal;
   a second depletion type MOSFET having a gate and a source connected to a drain of the first MOSFET; and
   a third depletion type MOSFET having a gate and a drain connected directly to a power supply and a source connected to a drain of the second MOSFET;
   said third MOSFET acting as a voltage divider in conjunction with said second MOSFET to decrease noise applied from said power supply through said third MOSFET to said second MOSFET;

wherein an output signal corresponding to the input signal is derived from the drain of the first MOSFET.

2. An integrated circuit according to claim 1 wherein a ratio of βd, which is a ratio of channel width and channel length of the first MOSFET, and βl, which is a ratio of channel width and channel length of the second MOSFET, is ten to twenty.

* * * * *